United States Patent
Li et al.

[19]

[11] Patent Number: 6,087,217
[45] Date of Patent: Jul. 11, 2000

[54] METHOD FOR IMPROVING CAPACITANCE IN DRAM CAPACITORS AND DEVICES FORMED

[75] Inventors: Mei-Yen Li; L. C. Chen, both of Hsin-chu, Taiwan

[73] Assignee: Taiwan Semiconductor Manufacturing Company, Ltd., Hsin Chu, Taiwan

[21] Appl. No.: 08/964,840

[22] Filed: Nov. 5, 1997

[51] Int. Cl.⁷ .................................................. H01L 21/8242
[52] U.S. Cl. ......................... 438/255; 438/253; 438/396; 438/398
[58] Field of Search ..................... 438/396, 398, 438/253, 254, 255, 397

[56] References Cited

U.S. PATENT DOCUMENTS

| | | | |
|---|---|---|---|
| 5,158,905 | 10/1992 | Ahn | 438/396 |
| 5,223,734 | 6/1993 | Lowrey et al. | 257/401 |
| 5,302,540 | 4/1994 | Ko et al. | 438/398 |
| 5,466,627 | 11/1995 | Lur et al. | 438/396 |
| 5,488,008 | 1/1996 | Kawamura | 438/398 |
| 5,670,405 | 9/1997 | Tseng | 438/396 |

*Primary Examiner*—Carl Whitehead, Jr.
*Assistant Examiner*—Toniae M. Thomas
*Attorney, Agent, or Firm*—Tung & Associates

[57] ABSTRACT

The present invention discloses a method for forming a DRAM capacitor that has improved charge capacity and a DRAM capacitor formed by such method. The method can be carried out by first depositing an oxide layer on a lower polysilicon electrode layer on a semiconductor structure, then polishing the top surface of the oxide layer to form an uneven surface which provides increased surface area, and then anisotropically etching away the oxide layer while reproducing the uneven surface of the oxide layer onto the lower polysilicon electrode layer such that an increased charge capacity can be realized. The anisotropic etch chemistry should be selected such that the etchant etches away both the oxide layer and the polysilicon layer, and preferably, the etchant should have a higher selectivity toward polysilicon and a lower selectivity toward oxide such that the oxide layer can be completely removed while only a portion of the polysilicon layer is removed to form the uneven surface.

21 Claims, 2 Drawing Sheets

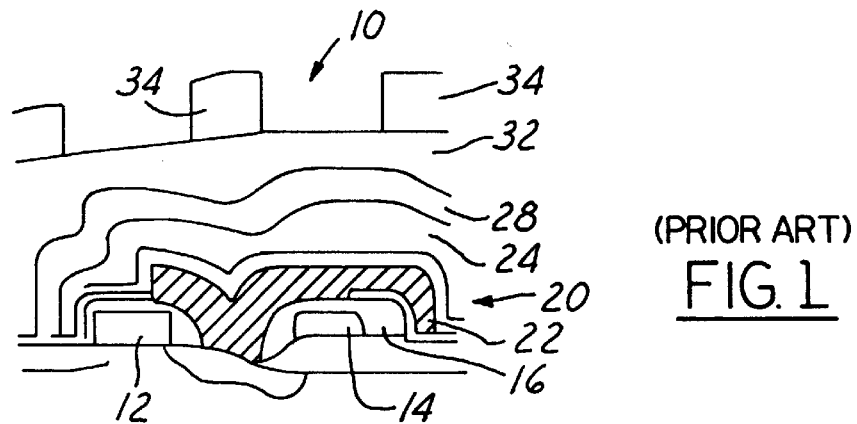
(PRIOR ART)
FIG. 1
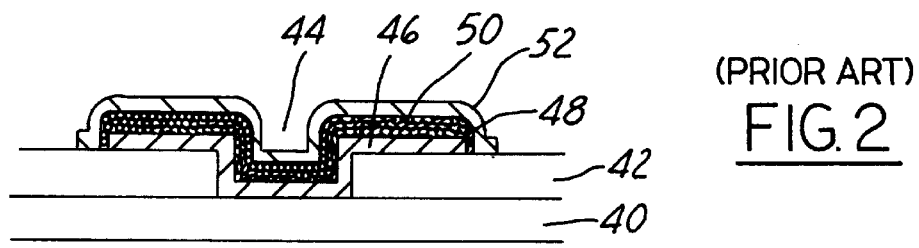
(PRIOR ART)
FIG. 2
FIG. 3
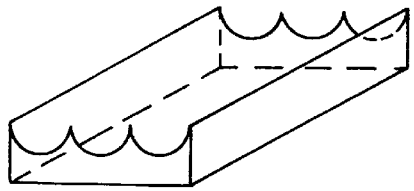
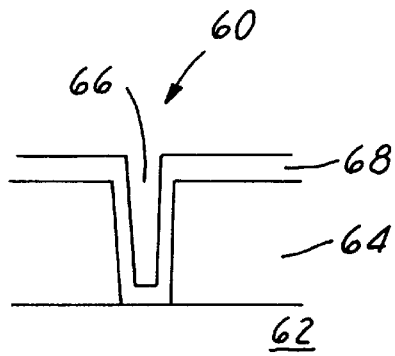
FIG. 4
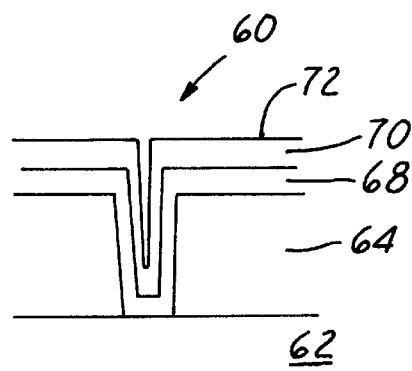
FIG. 5

METHOD FOR IMPROVING CAPACITANCE IN DRAM CAPACITORS AND DEVICES FORMED

FIELD OF THE INVENTION

The present invention generally relates to a method for making a dynamic random access memory (DRAM) capacitor and capacitor made by such method and more particularly, relates to a method for making a DRAM capacitor which has increased capacitance by first depositing an oxide layer on a polysilicon lower electrode layer, then polishing the oxide layer forming an uneven top surface, and then anisotropically etching the uneven surface such that the same surface texture is reproduced on the polysilicon lower electrode layer and capacitor formed by such method.

BACKGROUND OF THE INVENTION

A typical DRAM cell includes a transistor and a storage capacitor. In the early DRAM cells, storage capacitors of the planar type were used which require the use of large wafer real estate. In recent years, as the size of IC device is continuously miniaturized when smaller chips are made and more devices are packed into a chip, the circuit density on the chip increases to such an extent that the specific capacitance of a storage capacitor must be increased in order to meet such demand. Since chip real estate is limited, the only feasible way of increasing the specific capacitance of a storage capacitor is to increase it three-dimensionally, i.e., to grow the capacitor cell in the vertical dimension and forming a stacked capacitor.

A stacked capacitor can be built on top of a transistor thus allowing a smaller cell to be built without losing the specific capacitance of the cell. It has become a popular design for use in modem semiconductor memory devices to save chip real estate. Other approaches in increasing the cell capacitance, such as the one that involves the formation of a deep trench for storing charges vertically requires complicated processing steps and thus is difficult to carry out.

In modern memory cells, where smaller dimension and higher specific capacitance are desirable characteristics, a DRAM capacitor can be formed by two layers of a semiconducting material and one layer of a dielectric material sandwiched thereinbetween. A suitable dielectric material utilized in such a capacitor includes a thin oxide layer or a composite oxide-nitride-oxide layer that is sandwiched between two semi-conducting layers of polysilicon for forming the capacitor cell. The capacitor is frequently formed over a bit line on the surface of a silicon substrate.

A typical 16-Mb DRAM cell is shown in FIG. 1. The DRAM cell 10 has a stacked capacitor 20 built on top. The formation of the DRAM cell 10 can be accomplished by first using standard CMOS fabrication steps to form a transistor and to provide a gate oxide layer (not shown). A word line 12 is then formed by first depositing a polysilicon layer of approximately 2500 Å and then doping the polysilicon with phosphorous. A thick layer of insulating material 16 such as TEOS (tetraethoxy silicate) oxide of approximately 3,000 Å is then deposited on top of the first polysilicon layer. By using a standard photomasking process, the two layers are defined and etched by a plasma etching technique. After LDD implants are made in the silicon substrate, oxide spacers are formed on the polysilicon gate structure by depositing a thick layer of TEOS oxide of approximately 2,000 Å and etching in a plasma process. Gates 12 and 14 are thus formed and covered by a thick oxide insulating layer 16. A source and drain mask is then applied to carry out an ion implantation process for forming the source and drain regions in the silicon substrate.

In the next fabrication step, photomasking is used to form openings for the cell contact and plasma etching is used to remove any native oxide layer on the silicon substrate. A second polysilicon layer 22 of approximately 3,500 Å is then deposited and patterned by a photomask to form the lower electrode of the stacked capacitor 20. A dielectric layer 24 of a composite film of oxide-nitride-oxide (ONO) is deposited as the dielectric layer for the capacitor. The total thickness of the ONO composite film is approximately 70 Å. The ONO composite film can be formed by using a thin layer of native oxide as the first oxide layer, depositing a thin nitride layer on top and then oxidizing the nitride layer to grow a top oxide layer. To complete the fabrication of the stacked capacitor, a third polysilicon layer 24 of approximately 2,000 Å thick is deposited on top of the dielectric layer and then doped and patterned by a photomask to form an upper electrode. After the formation of the stacked capacitor, peripheral devices can be formed by masking and ion implantation, followed by the formation of a bit line 28 of a polysilicon/metal silicide material. A thick insulating layer 32 of BPSG or SOG is then deposited over the capacitor and reflowed to smooth out the topography and to reduce the step height. Other back-end-processes such as metallization to form metal lines 34 are used to complete the fabrication of the memory device 10.

The stacked capacitor 10 shown in FIG. 1 has been successfully used in 16 Mb DRAM devices. However, as device density increases to 256 Mb or higher, the planar surface required for building this type of conventional stacked capacitors becomes excessive and must be reduced.

Others have proposed a technique of forming DRAM stack capacitors by using a rugged polysilicon layer as the lower electrode in a capacitor cell. This is shown in FIG. 2 wherein a semiconductor substrate 40 is presented which has a layer of a non-doped silicate glass 42 deposited on top. After the insulating layer 42 is patterned and etched in a conventional etching process, the substrate area 44 is exposed as the storage node capacitor cell contact. In the next processing step, a layer of polysilicon 46 is deposited and formed. The thickness of the polysilicon layer 46 is in the range between 400 Å and 600 Å. To increase the surface area of the polysilicon layer, a rugged surface polysilicon layer 48 is deposited at a relatively low deposition temperature of between 500° C. and 600° C. by a chemical vapor deposition technique. The deposition temperature of the rugged polysilicon must be kept low in order to maintain the wave-like surface texture of the rugged polysilicon. The thickness of the rugged polysilicon layer 48 is between 700 Å and 1000 Å. In a subsequent process, the polysilicon layer 46 and the rugged polysilicon layer 48 are patterned and etched to form a lower electrode of the capacitor cell. A second insulating layer, preferably of an oxide or an oxide-nitride-oxide insulating layer 50 is deposited by a chemical vapor deposition technique. After the second insulating layer 50 is patterned and etched to form a conformal layer on the capacitor cell, a final layer 52 of polysilicon is deposited by chemical vapor deposition and formed as the upper electrode in the capacitor cell.

A storage capacitor that has improved storage capacity can be fabricated by this process. However, the fabrication process is complicated based on the need for a low temperature process to form the rugged polysilicon layer. In a capacitor cell that incorporates rugged polysilicon, the device must not be subjected in a down-stream fabrication step, to a process temperature of higher than approximately 600° C. The high temperature would render the wave-like textured surface of the rugged polysilicon smooth and as a consequence, make it lose its increased storage capacity.

It is therefore an object of the present invention to provide a method for forming a DRAM capacitor that has improved storage capacity without the drawbacks or shortcomings of the conventional method.

It is another object of the present invention to provide a method for forming a DRAM capacitor that has improved storage capacity that does not require the formation of a low temperature rugged polysilicon layer as the lower electrode of the capacitor.

It is a further object of the present invention to provide a method for forming a DRAM capacitor that has improved storage capacity by first depositing an oxide layer on a polysilicon lower electrode layer and then forming an uneven top surface on the oxide layer.

It is another further object of the present invention to provide a method for forming a DRAM capacitor that has improved storage capacity by first depositing an oxide layer on a lower polysilicon layer, forming an uneven top surface on the oxide layer and then anisotropically etching the oxide layer and the polysilicon layer together such that the uneven top surface of the oxide layer is reproduced on the top surface of the polysilicon layer.

It is yet another object of the present invention to provide a method for forming a DRAM capacitor that has improved storage capacity by forming an uneven top surface in a lower polysilicon electrode layer consisting of grooves adjacent to each other such that the surface area of the electrode is increased.

It is still another object of the present invention to provide a method for forming a DRAM capacitor that has improved storage capacity by first depositing an oxide layer on a lower polysilicon electrode layer and then forming an uneven top surface on the oxide layer by a mechanical polishing method utilizing a diamond polishing disk.

It is still another further object of the present invention to provide a DRAM capacitor that has improved storage capacity by forming an uneven top surface on a lower polysilicon electrode layer that consists of grooves juxtaposed to each other wherein the grooves have a depth of at least 500 Å.

It is yet another further object of the present invention to provide a DRAM capacitor that has improved storage capacity which incorporates a lower polysilicon electrode layer that has an uneven surface consisting of grooves such that the surface area of the lower electrode layer is increased to improve its charge capacitance.

SUMMARY OF THE INVENTION

In accordance with the present invention, a method for forming a DRAM capacitor that has improved storage capacity and DRAM capacitors formed by such method are provided. In the method, a layer of oxide is first deposited on a lower polysilicon electrode layer and then polished by a mechanical polishing method to produce an uneven surface on the oxide layer. An anisotropic etching method is then used to etch away the oxide layer while reproducing the uneven surface of the oxide layer on the top surface of the polysilicon layer and thus improving its charge capacity by increasing its surface area.

In a preferred embodiment, a method for forming a DRAM capacitor is provided which includes the operating steps of first providing a cavity in a semiconductor substrate, then depositing a polysilicon layer in the cavity, then depos- iting an oxide layer on the polysilicon layer wherein the oxide layer has a top surface and a thickness, then forming an uneven surface on the top surface of the oxide layer, and then dry etching the oxide layer and the polysilicon layer such that the uneven surface in the top surface of the oxide layer is reproduced in the top surface of the polysilicon layer. The method may further include the steps of forming the polysilicon layer into a lower electrode, depositing a dielectric layer on the polysilicon layer, and then depositing a second polysilicon layer on the dielectric layer to form an upper electrode.

In an alternate embodiment, a method for improving capacitance in DRAM capacitors is provided which includes the operating steps of first providing a cavity in a semiconductor substrate, then depositing a first polysilicon layer in the cavity, then depositing an oxide layer to a predetermined thickness on the first polysilicon layer wherein the oxide layer has a top surface, then forming an uneven surface in the top surface of the oxide layer by a polishing method, and then anisotropically etching the oxide layer and the first polysilicon layer such that the uneven surface in the top surface of the oxide layer is reproduced in a top surface of the first polysilicon layer. The method may further include the steps of forming the first polysilicon layer into a lower electrode, depositing a dielectric layer on the first polysilicon layer, and then depositing a second polysilicon layer on the dielectric layer to form an upper electrode.

The present invention is further directed to a DRAM capacitor that has improved storage capacity which includes a cavity in a semiconductor substrate, a first polysilicon layer deposited in the cavity which has a substantially uneven top surface, a dielectric layer on top of the polysili- con layer, and a second polysilicon layer on top of the dielectric layer, wherein the substantially uneven top surface in the first polysilicon layer improves the storage capacity of the capacitor. The substantially uneven top surface of the first polysilicon layer may consist of a multiplicity of grooves formed immediately adjacent to each other. The first polysilicon layer and the second polysilicon layer can be formed of a doped polysilicon and have a thickness of between about 500 Å and about 8000 Å. The dielectric layer can be formed of an oxide or an oxide-nitride-oxide which has a thickness between about 50 Å and about 200 Å. The multiplicity of grooves on the top surface of the first polysilicon layer may have a depth of at least 500 Å.

BRIEF DESCRIPTION OF THE DRAWINGS

These and other objects, features and advantages of the present invention will become apparent from the following detailed description and the appended drawings in which:

FIG. 1 is an enlarged, cross-sectional view of a conventional stacked capacitor DRAM cell.

FIG. 2 is an enlarged, cross-sectional view of a conventional DRAM capacitor cell utilizing a rugged polysilicon layer as the lower electrode.

FIG. 3 is a perspective view of a mathematical model used for the surface area gain calculation for the present invention method.

FIG. 4 is an enlarged, cross-sectional view of a present invention structure which has a polysilicon layer deposited in a capacitor well.

FIG. 5 is an enlarged, cross-sectional view of the present invention structure shown in FIG. 4 after an oxide layer is deposited on top.

DETAILED DESCRIPTION OF THE PREFERRED EMBODIMENT

Figure 6:
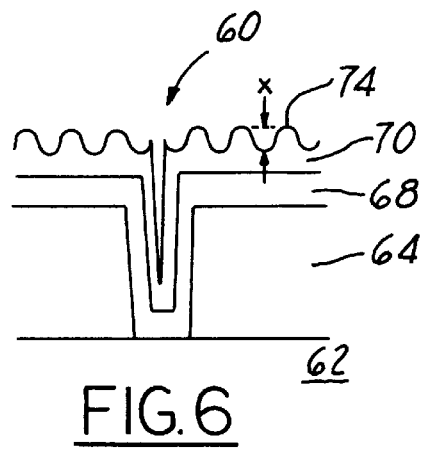
FIG. 6 is an enlarged, cross-sectional view of the present invention structure of FIG. 5 after a polishing method is conducted to form an uneven top surface on the oxide layer.

The present invention discloses a method for making a DRAM capacitor that has improved storage capacity by forming an uneven top surface on a lower polysilicon electrode layer such that the storage capacity is increased based on the increased surface area. The uneven top surface on the lower polysilicon electrode layer is formed by first depositing an oxide layer on top of a smooth lower polysilicon electrode layer, and then polishing the top surface of the oxide layer with a diamond polishing disk such that grooves are produced in the top surface. The DRAM structure is then etched in an anisotropic etching process such that the oxide layer is completely etched away while the uneven top surface of the oxide layer is reproduced in the top surface of the lower polysilicon electrode layer. The uneven top surface of the lower polysilicon electrode layer improves the storage capacity of the capacitor cell due to its improved surface area.

The uneven top surface on the oxide layer can be advantageously produced by use of a diamond polishing disk such that grooves are formed immediately adjacent to each other on the surface with a depth of at least 500 Å. The structure is then etched in a reactive ion etching apparatus or a plasma etching apparatus wherein fluorine-type or chlorine-type chemistry is used to etch away both the oxide layer and the polysilicon layer. It is desirable that the etch chemistry should have a higher selectivity for the polysilicon layer such that the oxide layer can be readily etched away while only a top layer of the polysilicon is etched to form the uneven surface. A fine grade of diamond polishing disk can be used such that grooves having a depth of between about 300 Å and about 2000 Å are produced on the surface of the oxide layer. The thickness of the oxide layer deposited on top of the polysilicon layer should be in the range between about 500 Å and about 3000 Å, while the thickness of the polysilicon layer can be anywhere between about 500 Å and about 8000 Å.

The present invention novel method for improving the storage capacitance by increasing the surface area of a polysilicon layer which is used as a lower electrode can be demonstrated by a mathematical equation for calculating maximum area gain. In a surface that is polished with grooves as shown in FIG. 3, the surface area gain can be calculated as the ratio between the surface area of the etched-back polished film divided by the surface area of the flat surface. This can be expressed as follows:

$$\text{Surface area gain} = \frac{\text{Surface area of the etched-back polished film}}{\text{Surface area of flat surface}}$$

$$= \frac{\frac{n}{2}(\pi a) \times w}{n\, a \times w}$$

$$= \frac{\pi}{2}$$

$$= 1.57$$

As shown by the equation, the surface area gain by the grooves is calculated at 1.57 times of the original surface area without the grooves. The maximum surface area gain therefore leads to a proportional capacitance gain and improves the storage capacity of the present invention DRAM capacitor.

Referring now to FIG. 4, wherein an enlarged, cross-sectional view of a present invention semiconductor structure 60 is shown. The semiconductor structure 60 is built on a semi-conducting substrate 62 which has an insulating layer 64 deposited thereon. The insulating layer 64 can be suitably deposited of an oxide material. A capacitor well 66 is then patterned by conventional photolithographic method and formed. Into the capacitor well 66, a polysilicon layer 68 is deposited to a suitable thickness between about 500 Å and about 8000 Å. The polysilicon layer 68 is normally doped to improve its electrical properties. It should be noted that there are other types of capacitors which are not formed into a well. The construction shown in FIG. 4 is only one of many possible configurations that can utilize the present invention novel method.

Onto the polysilicon layer 68, a layer of oxide material 70 is then deposited by a conventional method. This is shown in FIG. 5. The thickness of the oxide layer 70 can be suitably selected between about 500 Å and about 3000 Å, and preferably between about 500 Å and about 1000 Å. The thickness of the oxide layer 70 should be selected such that, after polishing into an uneven surface, the oxide layer can be readily etched away in an anisotropic etching process by a chlorine or a fluorine-based chemistry into the underlying polysilicon layer 68 such that the uneven surface can be reproduced on the latter.

In the next step of the fabrication process according to the present invention method, a mechanical polishing step is carried out on the top surface 72 of the oxide layer 70. A suitable mechanical polishing method may be similar to that normally used for preparing samples for transmission electron microscopic study of semiconductor materials, i.e., by using a diamond polishing disk. A fine grade diamond polishing disk is capable of producing grooves, as shown in FIG. 6, having a depth X of between about 300 Å and about 1000 Å, preferably between about 400 Å and about 800 Å and more preferably, between about 500 Å and about 600 Å. It should be noted that, other suitable polishing methods including that of chemical mechanical polishing can be used as long as a grooved surface having desirable dimensions can be produced. Ideally, the grooves produced should have a depth as that shown in FIG. 6. This assures the reproduction of the grooves on the underlying polysilicon layer when the structure is later subjected to an anisotropic etching process.

Figure 7:
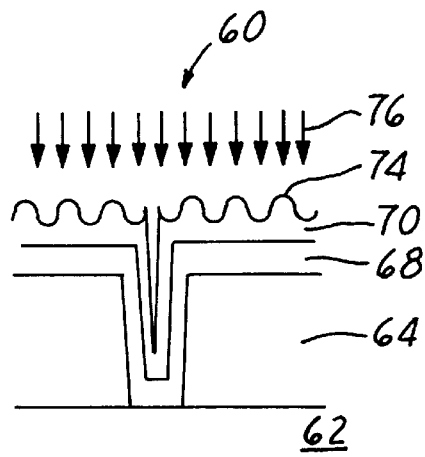
FIG. 7 is an enlarged, cross-sectional view of the present invention structure shown in FIG. 6 being etched in an anisotropic etching process.

The semiconductor structure 60 is then subjected to a reactive ion etching process or a plasma etching process. This is shown in FIG. 7. The reactive ions 76 bombard the grooved surface 74 of the oxide layer 70 in an anisotropic manner such that the pattern of the grooves can be reproduced on the underlying polysilicon layer 68. In conducting the reactive ion etching or plasma etching process, the etch chemistry should be carefully selected such that it is capable of etching both the oxide layer 70 and the polysilicon layer 68. Preferably, the etch chemistry should have a higher selectivity for the polysilicon layer 68 than the oxide layer 70 so that the oxide layer 70 can be readily etched away and then the polysilicon layer 68 is etched at a slower rate. As soon as the grooved surface 74 is reproduced on the polysilicon layer 68, the etch process can be stopped. It should be noted that the word "reproduced" does not necessarily mean that the "reproduced" profile on the polysilicon layer 68 is exactly the same as that on the oxide layer 70. As a matter of fact, the reproduced profile on the polysilicon layer 68 is usually not as steep as that found on the oxide layer 70 due to the etch selectivity.

Figure 8:
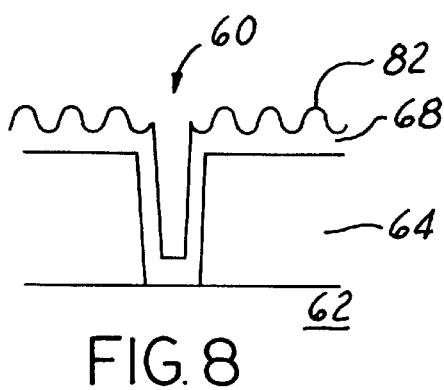
FIG. 8 is an enlarged, cross-sectional view of the present invention structure shown in FIG. 7 after the oxide layer is etched away and an uneven surface is reproduced on the polysilicon layer.

The polysilicon layer 68 should not be over etched. An ideally etched polysilicon surface 82 is shown in FIG. 8. The grooved surface 82 which is reproduced from the grooved surface 74 on the oxide layer 70 is achieved. When a suitable etch chemistry is selected, such as that based on fluorine or chlorine, the oxide layer can be etched away at a high rate while the polysilicon layer is etched at a lower rate to achieve its grooved surface 82. The etch chemistry therefore should have a higher selectivity for polysilicon and a lower selectivity for oxide. It should be noted that, while chlorine-based and fluorine-based chemistry are used to illustrate the present invention method, any other etch chemistry that is capable of etching oxide and polysilicon may also be used.

Figure 9:
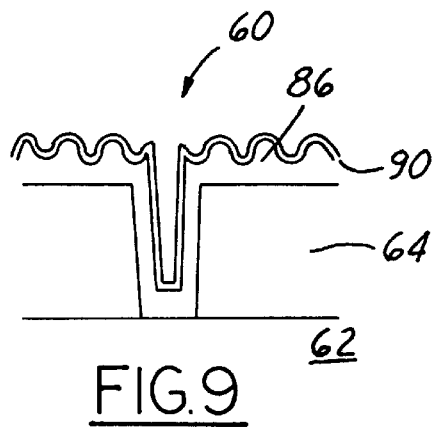
FIG. 9 is an enlarged, cross-sectional view of the present invention structure of FIG. 8 after a dielectric layer is deposited on top.
Figure 10:
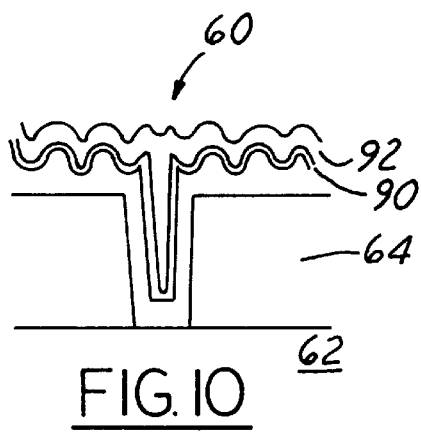
FIG. 10 is an enlarged, cross-sectional view of the present invention structure of FIG. 9 after a second polysilicon layer is deposited on top.
Figure 11:
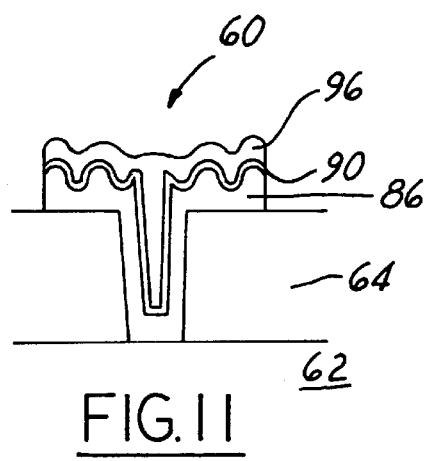
FIG. 11 is an enlarged, cross-sectional view of the present invention structure of FIG. 10 after the lower and upper electrode is defined and formed.

In the next step of the process, shown in FIG. 9, a thin dielectric layer 90 having a thickness in the range between about 50 Å and about 200 Å is deposited on top of the semiconductor structure 60. A suitable dielectric material for use as the insulating layer in a capacitor can be an oxide or an oxide-nitride-oxide (ONO) material, eventhough other suitable dielectric material may also be used. A second polysilicon layer 92, frequently doped with the same dopant as the first polysilicon layer 68 (shown in FIG. 4) is then deposited on top of the dielectric layer 90. A suitable thickness for the second polysilicon layer 92 may be between about 500 Å and about 8000 Å, depending on the specific capacitor design. In the final fabrication step, shown in FIG. 11, conventional photolithographic method and etching method are used to define the upper electrode 96 and lower electrode 86. A completed DRAM capacitor which has improved capacitance due to its increased surface area on the lower polysilicon electrode 86 is thus obtained.

The present invention novel method of forming a DRAM capacitor that has improved charge capacity is thus amply demonstrated by the above descriptions and by FIGS. 4~11. It should be noted that while a specific pattern of grooves formed by a polishing method is illustrated, any other pattern that is capable of increasing the surface area of the polysilicon lower electrode layer can also be used. For instance, the grooves may be deeper or shallower and may also be spaced apart at regular or irregular intervals. It should also be noted that while an oxide layer is used on top of the polysilicon lower electrode layer to form a polished pattern any other suitable buffer layers may also be used as long as patterns that provide increased surface area can be easily formed in its top surface. Since the buffer layer is removed subsequently during the formation of the patterned surface on the polysilicon lower electrode layer, the nature of material of the buffer layer is not important as long as it can be easily formed into an uneven surface and it can be easily etched away in an anisotropic etching process.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming a DRAM capacitor comprising the steps of:

depositing a polysilicon layer on a semi-conducting substrate, depositing an oxide layer on said polysilicon layer, said oxide layer having a top surface and a thickness, forming an uneven surface in said top surface of said oxide layer by a mechanical polishing method, and dry etching said oxide layer and said polysilicon layer such that said uneven surface in said top surface of said oxide layer is substantially reproduced in a top surface of said polysilicon layer.

2. A method according to claim 1, wherein said oxide layer is deposited to a thickness of at least 500 Å.

3. A method according to claim 1, wherein said polysilicon layer deposited is a doped polysilicon.

4. A method according to claim 1, wherein said polysilicon layer deposited has a thickness between about 500 Å and about 8000 Å.

5. A method according to claim 1 further comprising the steps of forming said polysilicon layer into a lower electrode, depositing a dielectric layer on said polysilicon layer, and depositing a second polysilicon layer on said dielectric layer forming an upper electrode.

6. A method according to claim 5, wherein said dielectric layer is deposited of an oxide or an oxide-nitride-oxide material.

7. A method according to claim 1, wherein said dry etching is conducted in a reactive ion etching process or a plasma etching process.

8. A method according to claim 1, wherein said dry etching step is conducted by a chemistry capable of etching both oxide and polysilicon.

9. A method according to claim 1, wherein said dry etching step is conducted by a fluorine-based or a chlorine-based chemistry.

10. A method according to claim 1, wherein said uneven surface in said top surface of said oxide layer is formed by grooves juxtaposed to each other.

11. A method according to claim 10, wherein said grooves have a depth of at least 300 Å.

12. A method according to claim 10, wherein said grooves are formed by polishing with a diamond polishing disk.

13. A method for improving capacitance in a DRAM capacitor comprising the steps of:

providing a capacitor well in a semi-conducting structure, depositing a first polysilicon layer in said capacitor well, depositing an oxide layer to a thickness on said first polysilicon layer, said oxide layer having a top surface, forming an uneven surface in said top surface of said oxide layer by a polishing method, and anisotropically etching said oxide layer and said first polysilicon layer such that said uneven surface in said top surface of said oxide layer is reproduced in a top surface of said first polysilicon layer.

14. A method according to claim 13 further comprising the steps of:

forming said first polysilicon layer into a lower electrode, depositing a dielectric layer on said first polysilicon layer, and depositing a second polysilicon layer on said dielectric layer forming an upper electrode.

15. A method according to claim 13, wherein said oxide layer is deposited to a thickness of at least 500 Å, and preferably to a thickness of at least 750 Å.

16. A method according to claim 13, wherein said first polysilicon layer deposited is a doped polysilicon having a thickness between about 500 Å and about 8000 Å.

17. A method according to claim 14, wherein said dielectric layer deposited is an oxide or an oxide-nitride-oxide layer.

18. A method according to claim 13, wherein said anisotropic etching is conducted in a reactive ion etching chamber or a plasma etching chamber.

19. A method according to claim 14, wherein said first and said second polysilicon layers deposited are doped polysilicon.

20. A method according to claim 13, wherein said uneven surface in said top surface of said oxide layer is formed by grooves juxtaposed to each other.

21. A method according to claim 20, wherein said grooves have a depth of at least 300 Å.

* * * * *